(12) United States Patent
Yang

(10) Patent No.: US 12,707,789 B2
(45) Date of Patent: Aug. 11, 2026

(54) LED LIGHT BULB AND MANUFACTURING PROCESS THEREOF

(71) Applicant: LINHAI TIAN TIAN LIGHTING CO., LTD., Taizhou (CN)

(72) Inventor: Guanghao Yang, Taizhou (CN)

(73) Assignee: LINHAI TIAN TIAN LIGHTING CO., LTD., Zhejiang (CN)

( * ) Notice: Subject to any disclaimer, the term of this patent is extended or adjusted under 35 U.S.C. 154(b) by 0 days.

(21) Appl. No.: 19/037,679

(22) Filed: Jan. 27, 2025

(65) Prior Publication Data

US 2026/0123123 A1 Apr. 30, 2026

(30) Foreign Application Priority Data

Oct. 30, 2024 (CN) ........................ 202411524918.6

(51) Int. Cl.
*H10H 20/857* (2025.01)
*F21K 9/66* (2016.01)
(Continued)

(52) U.S. Cl.
CPC ............. *H10H 20/857* (2025.01); *F21K 9/66* (2016.08); *F21K 9/90* (2013.01); *H10H 20/0364* (2025.01);
(Continued)

(58) Field of Classification Search
CPC ......... F21K 9/66; F21K 9/90; H10H 20/0364; H10H 20/8502; H10H 20/857
See application file for complete search history.

(56) References Cited

U.S. PATENT DOCUMENTS 2,800,416 A * 7/1957 Walters ..................... C23C 2/00 118/74
H65 H * 5/1986 Beni ..................... B25J 19/021 414/730

(Continued)

FOREIGN PATENT DOCUMENTS

CN 204441542 U 7/2015
CN 213118522 U 5/2021
DE 21 2017000 038 U1 6/2018

OTHER PUBLICATIONS

Dec. 6, 2024 Notice of Allowance issued in Chinese Patent Application No. 202411524918.6.

(Continued)

*Primary Examiner* — Abdulmajeed Aziz
*Assistant Examiner* — Nathaniel J Lee
(74) *Attorney, Agent, or Firm* — Oliff PLC

(57) ABSTRACT

An LED light bulb includes a first bent segment is formed at a top end of a first pin, and a second bent segment is formed at a top end of a second pin, the first bent segment and the second bent segment being substantially disposed on a first plane to form a mounting platform, the first plane being substantially perpendicular to an axial direction of a glass shade, the first bent segment and the second bent segment being spaced apart and bent in opposite directions; the LED illuminant is secured on the mounting platform and welded to the first bent segment and the second bent segment in an electrically conductive manner, respectively; and the package body encapsulates the LED illuminant and respective weld joints between the LED illuminant and the first bent segment and between the LED illuminant and the second bent segment.

9 Claims, 3 Drawing Sheets

(51) Int. Cl.

| | |
|---|---|
| ***F21K 9/90*** | (2016.01) |
| ***H10H 20/01*** | (2025.01) |
| ***H10H 20/85*** | (2025.01) |
| *F21V 1/20* | (2006.01) |
| *F21Y 115/10* | (2016.01) |

(52) U.S. Cl.

CPC ........... *H10H 20/8502* (2025.01); *F21V 1/20* (2013.01); *F21Y 2115/10* (2016.08)

(56) References Cited

U.S. PATENT DOCUMENTS

| | | | | |
|---|---|---|---|---|
| 5,923,536 | A * | 7/1999 | Lumbard | H05K 7/1015 361/752 |
| 2007/0139949 | A1* | 6/2007 | Tanda | F21K 9/232 257/E33.059 |
| 2010/0253221 | A1* | 10/2010 | Chiang | F21K 9/232 315/32 |
| 2013/0235592 | A1* | 9/2013 | Takeuchi | F21V 23/002 362/363 |
| 2018/0010738 | A1* | 1/2018 | Lin | H10H 20/8506 |

OTHER PUBLICATIONS

Oct. 30, 2024 Search Report issued in Chinese Patent Application No. 2024115249186.

* cited by examiner

LED LIGHT BULB AND MANUFACTURING PROCESS THEREOF

FIELD

The subject matter described herein relates to a luminaire, and more particularly relates to an LED light bulb and a manufacturing process thereof.

BACKGROUND

With improvement of living standards of common people, decorative lights are becoming increasingly popular to add an extra touch of festivity. Conventional light bulbs use a tungsten filament as a light producing element. Currently, with technological advancements, a light emitting diode (LED) has gradually replaced the tungsten filament as the light producing element.

For example, the Chinese patent CN213746184U discloses a glass LED Christmas light bulb, which uses a LED as a light emitting element. The glass LED Christmas light bulb specifically comprises a direct plug-in LED illuminant and a glass shade over the direct plug-in LED illuminant, the direct plug-in LED illuminant and the glass shade being formed of an integral structure; a bead of the direct plug-in LED illuminant is disposed in the glass shade; a light transmissive space is provided between the bead of the LED illuminant and an inner cavity of the glass shade; pins of the direct plug-in LED illuminant project out of a base of the glass shade. The direct plug-in LED illuminant comprises a package body, a positive pin, a negative pin, a LED bracket, and a LED chip, the LED bracket and the LED chip being encapsulated in the package body, the LED chip being welded on the LED bracket; four outwardly depressed concave lenses and one planar lens are arranged in the package body above the LED bracket, the four concave lenses being located along quarter lines of the planar lens to thereby surround the planar lens, respectively, the edges of the four concave lenses being tangent to the planar lens and the interior walls of the package body, respectively; the package body is disposed in the glass shade; the positive pin and the negative pin are connected to the circuit of the LED bracket; the positive pin and the negative pin project out of the base of the glass shade. In the conventional technology, the LED chip is welded on the LED bracket on top of the negative pin so that it is supported by only one pin; to ensure reliable fixation of the LED chip, the LED bracket needs to be manufactured with an area large enough to hold the LED chip, so that the top appears to have a larger size, which not only degrades the aesthetics but also increases the bead size of the LED illuminant while shrinking the gap between the bead and the interior wall of the glass shade, causing difficulty in mounting the bead into the glass shade. Such a fixation solution is also seen in the Chinese patents CN202695531U, CN205353994U, CN202613105U, and CN109713111A, where the positive pin and the negative pin of the LED illuminant are electrically connected via a wire, which not only increases manufacturing difficulty, but also requires more weld joints leading to unsatisfactory reliability over long-term service.

To overcome the problems noted supra, a solution of directly welding the LED light to top ends of two pins is disclosed in the Chinese patents CN220749961U, CN221348909U, CN109192837A, and CN212392260U. For example, the Chinese patent CN221348909U discloses a light source apparatus, comprising a transparent protective cover, a LED assembly, and a refractive lens, the transparent protective cover having an accommodation cavity with one end open; the LED assembly is disposed in the accommodation cavity and configured to emit light; the refractive lens is disposed covering or enveloping the LED assembly, one face of the refractive lens proximal to the LED assembly being an incident face, one face of the refractive lens facing away from the LED assembly being an emergent face, the emergent face being configured to refract the light passing through the emergent face. The LED assembly comprises a LED chip, a first electrically conductive post, and a second electrically conductive post, the first electrically conductive post and the second electrically conductive post being spaced at an interval; the LED chip is electrically connected to the first electrically conductive post and the second electrically conductive post. The first electrically conductive post and/or the second electrically conductive post comprise a connecting portion and a conducting portion, the connecting portion and the conducting portion being sequentially connected; the connecting portion is located in the transparent protective cover, and the conducting portion extends out of the transparent protective cover; a mounting platform is arranged at one end of the connecting portion distal from the conducting portion; the LED chip is adhesively attached on the mounting platform. However, the conventional technologies noted supra have such a problem that the pins are slim with a diameter of about 0.2 mm, so that to ensure the contact area with the LED illuminant and enhance securing reliability of the welded LED, it is needed to increase the width of the top ends of the pins, for example, to form a mounting platform structure noted supra, which plays a limited role in enhancing long-term service reliability.

SUMMARY

A LED light bulb is provided to solve the low reliability problem caused by directly welding a LED illuminant to a pin top, which enhances reliability of the LED illuminant welded to pins and significantly enhances long-term service reliability of a LED bead.

A technical solution described herein is set forth below: a LED light bulb, comprising a glass shade and a LED bead, the LED bead being encapsulated in the glass shade, the LED bead comprising a first pin, a second pin, a LED illuminant, and a package body, the first pin and the second pin projecting out from a base of the glass shade, wherein a first bent segment is formed at a top end of the first pin, and a second bent segment is formed at a top end of the second pin, the first bent segment and the second bent segment being substantially disposed on a first plane to form a mounting platform, the first plane being substantially perpendicular to an axial direction of the glass shade, the first bent segment and the second bent segment being spaced apart and bent in opposite directions; the LED illuminant is secured on the mounting platform and welded to the first bent segment and the second bent segment in an electrically conductive manner, respectively; and the package body encapsulates the LED illuminant and respective weld joints between the LED illuminant and the first bent segment and between the LED illuminant and the second bent segment.

With the technical solution noted supra, the disclosure offers the following benefits: the first bent segment and the second bent segment are formed to have sufficient length by bending the first pin and the second pin; since the first bent segment and the second bent segment are substantially located on the first plane, a mounting platform is formed, which allows for the LED illuminant to be stably supported before welding; this not only facilitates locating and welding the LED illuminant for automated manufacturing of the LED bead, but also can significantly enhance reliability of the LED illuminant securely welded to the first pin and the second pin due to sufficient contact length of the LED illuminant with respect to the first bent segment and the second bent segment, thereby significantly enhancing long-term service reliability of the LED bead. The first bent segment and the second bent segment being substantially located on the first plane means they may both extend on the first plane, or may incline with a small angle relative to the first plane, so long as the LED illuminant can be located flatly, which facilitates subsequent welding for secureness. Since the first plane is substantially perpendicular to the axial direction of the glass shade, the light is radiated out circumferentially at 360° with the LED chip as the center, covering substantially a hemispherical scope with uniform irradiation and achieving a higher lighting effect under a same watt. The first plane being substantially perpendicular to the axial direction means that the first plane may be perpendicular to the axial direction of the glass shade or may incline with a small angle relative to the axial direction of the glass shade so long as an effect of 360° light radiation to the top is achieved as best as possible. By encapsulating, in the package body, the LED illuminant and the respective weld joints between the LED illuminant and the first bent segment and between the LED illuminant and the second bent segment, the light can be guided to uniformly radiate out, which further enhances reliability of the LED illuminant securely welded to the first pin and the second pin. By spacing the first bent segment and the second bent segment apart, a reliable electrical insulation performance is achieved; by bending the first bent segment and the second bent segment in opposite directions, a symmetrical structure about the center of the LED illuminant may be formed, so that stresses imposed on the LED illuminant securely welded to the first bent segment and the second bent segment can be mostly neutralized relative to each other, which further enhances long-term structural stability of the securely welded LED illuminant and facilitates extending the service life of the LED bead.

Furthermore, the LED light bulb adopts a white light source, the LED illuminant adopts a LED which emits white light, the package body adopts a transparent, colorless encapsulant, and the glass shade adopts colorless glass.

Furthermore, the LED light bulb adopts a colored light source, the LED illuminant adopts a LED which emits colored light, the package body adopts a transparent, colorless encapsulant, and the glass shade adopts colorless glass;

or, the LED light bulb adopts a colored light source, the LED illuminant adopts a LED which emits white light, the package body adopts a transparent, colored encapsulant, and the glass shade adopts colorless glass;

or, the LED light bulb adopts a colored light source, the LED illuminant adopts a LED which emits white light, the package body adopts a transparent, colorless encapsulant, and the glass shade adopts colored glass.

The disclosure further provides a LED light bulb manufacturing process, applied to manufacture the LED light bulb noted supra, comprising a LED bead manufacturing procedure and a LED bead encapsulating procedure, wherein the LED bead manufacturing procedure comprises:

S100: forming a first pin and a second pin with a metallic filament of a predetermined length;

S110: forming a first bent segment by bending a top end of the first pin and forming a second bent segment by bending a top end of the second pin, the first bent segment and the second bent segment being bent in opposite directions to thereby form a mounting platform;

S120: forming a wick structure by securely welding a LED illuminant placed on the mounting platform;

S130: flipping the wick structure upside-down so that the LED illuminant faces downward, impregnating the LED illuminant in an encapsulant so that the encapsulant envelops the LED illuminant as well as respective weld joints between the LED illuminant and the first bent segment and between the LED illuminant and the second bent segment;

S140: forming a LED bead by curing the encapsulant to form a package body; and

S150: inspecting the LED bead by turning it on, wherein if the LED bead lights up, it is determined to be a qualified product.

With the technical solution noted supra, by bending the first bent segment and the second bent segment in opposite directions, the stresses imposed on the LED illuminant which has been securely welded on the first bent segment and the second bent segment can be at least partially neutralized; the first bent segment and the second bent segment form a cantilever structure, which plays a certain role of elastic support; the stresses imposed on the first bent segment and the second bent segment on which the LED illuminant has been securely welded may be directly absorbed and dissipated by the first bent segment and the second bent segment, which enhances long-term structural stability of the securely welded LED illuminant and extends the service life of the LED bead. By adopting a UV glue as the encapsulant, the glue can be cured faster when being irradiated under a UV lamp. By flipping the wick structure upside-down and impregnating it in the encapsulant, the package body may be contributed a more uniform, smoother surface structure with a better light transmissive effect.

Furthermore, the S110 further comprises: scraping off dirt from respective top surfaces of the first bent segment and the second bent segment while forming the first bent segment and the second bent segment by bending.

Furthermore, the LED bead manufacturing procedure further comprises between S100 and S110:

S101: transporting the first pin and the second pin engaged by a gripper to an inspection workstation where whether the first pin and the second pin are present on the gripper is inspected; continuing manufacturing in the case of presence, while suspending manufacturing in the case of absence.

Furthermore, the LED bead manufacturing procedure further comprises after S101:

S102: flattening top ends of the first pin and the second pin to increase respective contact areas between the first bent segment and the LED illuminant and between the second bent segment and the LED illuminant.

Furthermore, the S110 further comprises: when forming the first bent segment and the second bent segment by bending, performing shaping treatment to the first pin and the second pin so that the first pin forms a structure comprising a first base and a first inclined segment and the second pin forms a structure comprising a second base and a second inclined segment, the first inclined segment being connected between the first base and the first bent segment, the second inclined segment being connected between the second base and the second bent segment, an inclined angle between the first inclined segment and the first bent segment being an acute angle, an inclined angle between the second inclined segment and the second bent segment being an acute angle, the first bent segment and the second bent segment being bent in opposite directions perpendicular to a plane defined by the first base and the second base.

Furthermore, the LED bead manufacturing procedure further comprises between S110 and S120:

- S111: adjusting spacing between the first bent segment and the second bent segment to satisfy a predetermined requirement.

Furthermore, the S120 comprises:

- S121: applying a solder on respective top surfaces of the first bent segment and the second bent segment;
- S122: disposing the LED illuminant flatly on the first bent segment and the second bent segment from top to down; and
- S123: heating the solder on the first bent segment and the second bent segment and cooling by air blowing so as to securely weld the LED illuminant.

BRIEF DESCRIPTION OF THE DRAWINGS

Hereinafter, the disclosure will be further described with reference to the accompanying drawings, in which.

DETAILED DESCRIPTION OF EMBODIMENTS

Figure 1:
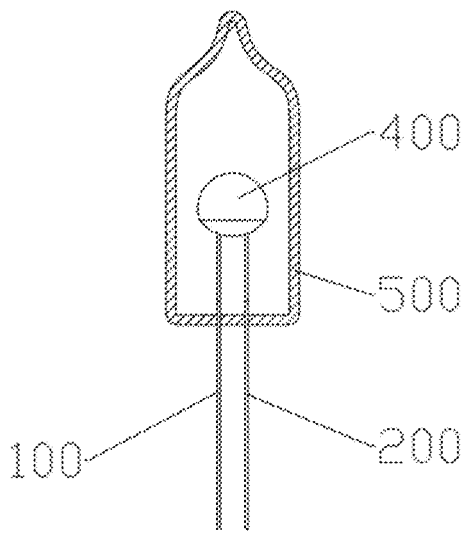
FIG. 1 is a schematic diagram of a LED light bulb according to the disclosure.

To make the objectives, technical solutions, and advantages of the implementations of the disclosure more apparent, the technical solutions in the implementations of the disclosure will be described in a clear and comprehensive manner with reference to the accompanying drawings; it is apparent that the example implementations described herein are only part of the implementations of the disclosure, not all of them.

The terms such as "first" and "second" (if existent) referred to in the specification and claim of the disclosure are used for distinguishing like objects, not necessarily used for describing a specific sequence or priority. Even if a technical feature is referred to with "second," it does not necessary indicate that there surely exists a "first" such feature. It would be understood that the terms "comprise" and "have," as well as any of their variants, intend for a non-exclusive inclusion. It would be understood that in the disclosure, the term "plurality" refers to two or more. The term "and/or" only describes an association relationship of associated objects, which indicates that there may exist three relationships, e.g., X and/or Y may indicate three circumstances: X individually, or both X and Y together, or Y individually. The character "/" generally indicates a relationship of "or" between the former and latter associated objects. The term "comprising X, Y, and Z" or "comprising X, Y, Z" refers to comprising all of X, Y, and Z; the term "comprising X, Y, or Z" refers to comprising one of X, Y, and Z; the term "comprising X, Y and/or Z" refers to comply any one, or any two, or three of X, Y, and Z.

Hereinafter, the technical solution of the disclosure will be described in detail through example implementations. The example implementations described infra may be combined or replaced with each other dependent on actual circumstances, and same or similar concepts or processes may be omitted in some implementations.

First Implementation

As illustrated in FIGS. 1 through 5, a LED light bulb according to the disclosure comprises a glass shade 500 and a LED bead, the LED bead being encapsulated in the glass shade 500; the LED bead comprises a first pin 100, a second pin 200, a LED illuminant 300, and a package body 400; the first pin 100 and the second pin 200 project out of a base of the glass shade 500; a first bent segment 12 is formed at a top end of the first pin 100, and a second bent segment 22 is formed at a top end of the second pin 200, the first bent segment 12 and the second bent segment 22 being substantially located on a first plane M1 to form a mounting platform, the first plane M1 being substantially perpendicular to an axial direction of the glass shade 500, the first bent segment 12 and the second bent segment 22 being spaced apart and bent in opposite directions; the LED illuminant 300 is secured on the mounting platform and welded to the first bent segment 12 and the second bent segment 22 in an electrical conductive manner; and the package body 400 encapsulates the LED illuminant 300 and respective weld joints between the LED illuminant 300 and the first bent segment 12 and between the LED illuminant 300 and the second bent segment 22.

Figure 2:
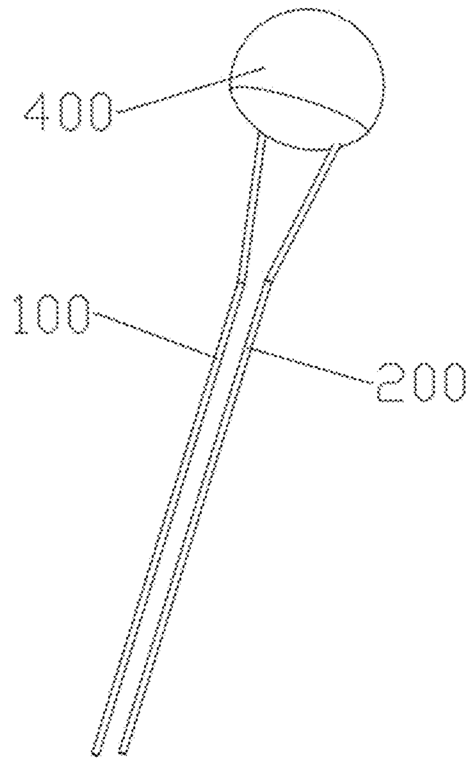
FIG. 2 is a schematic diagram of a LED bead according to the disclosure (with a LED wick structure completely encapsulated)
Figure 3:
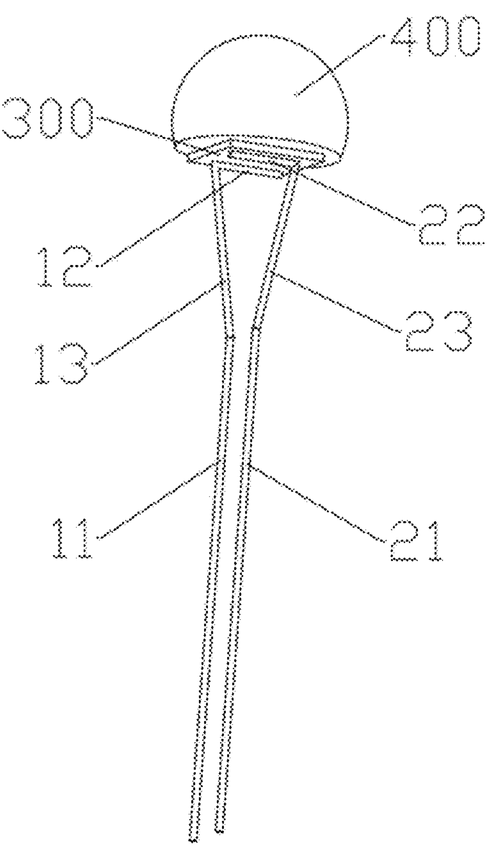
FIG. 3 is a schematic diagram of a LED bead (weld joints where a LED illuminant is soldered to a first bent segment and a second bent segment are not encapsulated)
Figure 4:
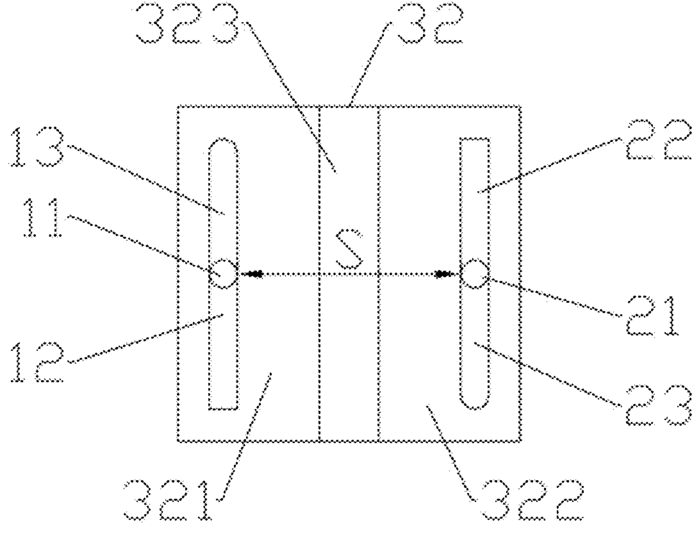
FIG. 4 is a bottom view of a wick structure according to the disclosure.
Figure 5:
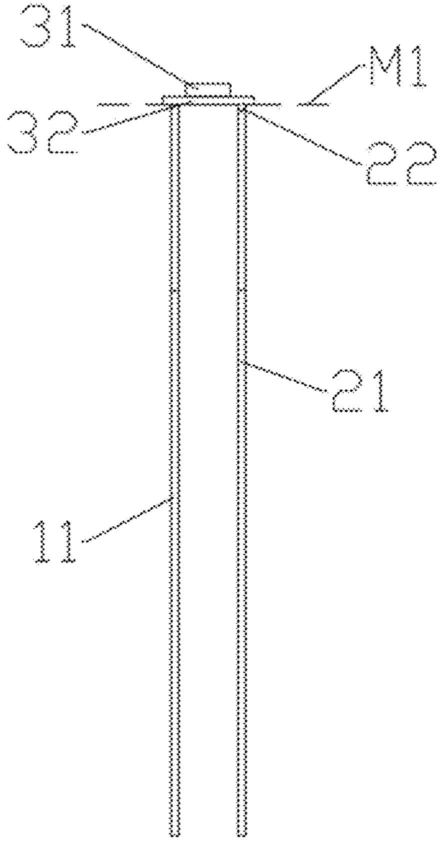
FIG. 5 is a front view of a wick structure according to the disclosure.

To ease the description, orientations such as top and bottom referred to herein may be understood with reference to FIGS. 1 through 3, in which the upward direction is referred to as top and the downward direction is referred to as bottom.

The first bent segment 12 and the second bent segment 12 are formed to have a sufficient length by bending the first pin 100 and the second pin 200; since the first bent segment 12 and the second bent segment 22 are substantially located on the first plane, a mounting platform is formed, which allows for the LED illuminant 300 to be stably supported before welding; this not only facilitates locating and welding the LED illuminant 300 for automated manufacturing of the LED bead, but also can significantly enhance reliability of the LED illuminant 300 securely welded to the first pin 100 and the second pin 200 due to sufficient contact length of the LED illuminant 300 with respect to the first bent segment 12 and the second bent segment 22, thereby significantly enhancing long-term service reliability of the LED bead. The first bent segment 12 and the second bent segment 22 being substantially located on the first plane M1 means they may both extend on the first plane M1, or may incline with a small angle relative to the first plane M1, so long as the LED illuminant 300 can be located flatly, which facilitate subsequent welding for secureness.

Since the first plane is substantially perpendicular to the axial direction of the glass shade 500, the light is radiated out circumferentially at 360° with the LED chip as the center, covering substantially a hemispherical scope with uniform irradiation and achieving a higher lighting effect under a same watt. The first plane M1 being substantially parallel to the axial direction of the glass shade 500 means that the first plane M1 may be perpendicular to the axial direction of the glass shade 500 or may incline with a small angle relative to the axial direction of the glass shade 500, so long as an effect of 360° light radiation to the top is achieved as best as possible.

By encapsulating, in the package body 400, the LED illuminant 400 and the respective weld joints between the LED illuminant 300 and the first bent segment 12 and between the LED illuminant 300 and the second bent segment 22, the light can be guided to uniformly radiate out, which further enhances reliability of the LED illuminant 300 securely welded to the first pin 100 and the second pin 200.

By spacing the first bent segment 12 and the second bent segment 22 apart, a reliable electrical insulation performance is achieved; by bending the first bent segment 12 and the second bent segment 22 in opposite directions, a symmetrical structure about the center of the LED illuminant 300 may be formed, so that stresses imposed on the LED illuminant 300 securely welded to the first bent segment 12 and the second bent segment 22 can be mostly neutralized relative to each other, which further enhances long-term structural stability of the securely welded LED illuminant 300 and facilitates extending the service life of the LED bead.

The LED illuminant 300 may adopt a surface-mounted LED, generally comprising a LED chip 31 and a substrate 32, the LED chip 31 and the substrate 32 being integrated into one piece, the LED chip 31 being disposed on a front surface of the substrate 32, and a positive weld joint surface 321 and a negative weld joint surface 322 are provided on a back side of the substrate 32, the positive weld joint surface 321 and the negative weld joint surface 322 being spaced apart by an insulative gap 323, the first bent segment 12 being securely welded to the positive weld joint surface 321, the second bent segment 22 being securely welded to the negative weld joint surface 322. The LED illuminant 300 may also adopt a non-polarized LED, which does not distinguish the positive and the negative, just requiring the first bent segment 12 and the second bent segment 22 be arbitrarily welded to the two weld joint surfaces, respectively.

A color of the light emitted by the LED bead can also be customized, e.g., the LED light bulb may adopt a white light source, and correspondingly, the LED illuminant 300 adopts a LED which emits white light, the package body 400 adopts a transparent, colorless encapsulant; and the glass shade 500 adopts a colorless glass. For another example, the LED light bulb may be a colored light source, which may be implemented in various manners. In one implementation manner, the LED illuminant 300 adopts a LED which emits colored light, the package body 400 adopts a transparent, colorless encapsulant, and the glass shade 500 adopts a colorless glass, whereby the LED illuminant 300 emits a natural colored light. In another implementation manner, the LED illuminant 300 is a LED which emits white light, the package body 400 adopts a transparent, colored encapsulant, and the glass shade 500 adopts a colorless glass, whereby light of the corresponding color is emitted with other colors of light in the white light being absorbed by the package body 400. In a further implementation manner, the LED illuminant 300 is a LED which emits white light, the package body 400 adopts a transparent, colorless encapsulant, and the glass shade 500 is a colored glass, whereby light of the corresponding color is emitted with other colors of light in the white light being absorbed by the glass shade 500.

Second Implementation

The disclosure further provides a LED light bulb manufacturing process, which is applied to manufacture the LED light bulb described in the implementation supra, the structure of the LED light bulb referring to FIGS. 1 through 5; the LED light bulb manufacturing process comprises a LED bead manufacturing procedure and a LED bead encapsulating procedure, the LED bead manufacturing procedure comprising:

- S100: forming a first pin 100 and a second pin 200 with a metallic filament of a predetermined length;
- S110: forming a first bent segment 12 by bending a top end of the first pin 100 and forming a second bent segment 22 by bending a top end of the second pin 200, the first bent segment 12 and the second bent segment 22 being bent in opposite directions to thereby form a mounting platform;
- S120: forming a wick structure by securely welding a LED illuminant 300 placed on the mounting platform;
- S130: flipping the wick structure upside-down so that the LED illuminant 300 faces downward, impregnating the LED illuminant 300 in an encapsulant so that the encapsulant envelops the LED illuminant 300 as well as respective weld joints between the LED illuminant 300 and the first bent segment 12 and between the LED illuminant 300 and the second bent segment 22;
- S140: forming a LED bead by curing the encapsulant to form a package body 400;
- S150: inspecting the LED bead by turning it on, where if the LED bead lights up, it is determined to be a qualified product.

The first pin 100 and the second pin 200 generally adopt Dumet wire; the Dumet wire, whose thermal expansion coefficient is close to glass, is well suited for a product having the LED bead encapsulated in the glass shade 500; the length of the first pin 100 and the second pin 200 may be controlled to 20 mm±2 mm. The encapsulant may generally adopt a typical transparent glue such as epoxy or UV glue, which has good moisture-proof and insulative properties. By bending the first bent segment 12 and the second bent segment 22 in opposite directions, the stresses imposed on the LED illuminant 300 which has been securely welded on the first bent segment 12 and the second bent segment 22 can be at least partially neutralized; the first bent segment 12 and the second bent segment 22 form a cantilever structure, which plays a certain role of elastic support; the stresses imposed on the first bent segment 12 and the second bent segment 22 on which the LED illuminant 300 has been securely welded may be directly absorbed and dissipated by the first bent segment 12 and the second bent segment 22, which enhances long-term structural stability of the securely welded LED illuminant 300 and extends the service life of the LED bead. By adopting a UV glue as the encapsulant, the glue can be cured faster when being irradiated under a UV lamp. By flipping the wick structure upside-down and impregnating it in the encapsulant in step S130, the package body 400 may be contributed a more uniform, smoother surface structure with a better light transmissive effect.

To improve the flatness of the first bent segment 12 and the second bent segment 22 as well as their electrical conduction performance with the welded LED illuminant 300, step S110 may further comprise: scraping off dirt from respective top surfaces of the first bent segment 12 and the second bent segment 22 while forming the first bent segment 12 and the second bent segment 22 by bending. Since the bend-forming and scraping are performed simultaneously, no addition operation is needed, which improves efficiency.

Considering continuity in automated manufacturing, to prevent the LED illuminant 300 from being placed with absence of the mounting platform, a step below may be added between step S100 and step S110 in the LED bead manufacturing procedure:

S101: transporting the first pin 100 and the second pin 200 engaged by a gripper to an inspection workstation where whether the first pin 100 and the second pin 200 are present on the gripper is inspected; continuing manufacturing in the case of presence, while suspending manufacturing in the case of absence. Step S101 ensures that the mounting platform is formed after processing the first pin 100 and the second pin 200, which prevents the LED illuminant 300 from being placed with absence of the mounting platform and falling off to cause waste; therefore, this step can save manufacturing costs.

To increase placement stability of the LED illuminant 300, the LED bead manufacturing procedure further comprises a step below after step S101:

S102: flattening top ends of the first pin 100 and the second pin 200 to increase respective contact areas between the first bent segment 12 and the LED illuminant 300 and between the second bent segment 22 and the LED illuminant 300.

Larger contact areas between the first/second bent segments 12, 22 and the LED illuminant 300 improve reliability of pre-locating and subsequent welding of the LED illuminant 300.

Since the LED illuminant 300 generally has a rectangular structure, to facilitate automated flow line processing, when placing the LED illuminant 300 on the mounting platform, the first bent segment 12 and the second bent segment 22 may be controlled to be substantially parallel or perpendicular to width edges of the LED illuminant 300 to thereby ensure the contact lengths therebetween, which achieves reliable pre-locating of the placed LED illuminant 300 and further ensures subsequent welding reliability. Therefore, S110 further comprises: when forming the first bent segment 12 and the second bent segment 22 by bending, performing shaping treatment to the first pin 100 and the second pin 200 so that the first pin 100 forms a structure comprising a first base 11 and a first inclined segment 13 and the second pin 200 forms a structure comprising a second base 21 and a second inclined segment 23, the first inclined segment 13 being connected between the first base 11 and the first bent segment 12, the second inclined segment 23 being connected between the second base 21 and the second bent segment 22, an included angle between the first inclined segment 13 and the first bent segment 12 and an included angle between the second inclined segment 23 and the second bent segment 22 being both acute angles. During the manufacturing process, the gripper would engage the first base 11 and the second base 21 simultaneously, equivalent to controlling the first base 11 and the second base 21 to be parallel; on this basis, the first bent segment 12 and the second bent segment 22 may be bent in opposite directions perpendicular to a plane defined by the first base 11 and the second base 21, ensuring that the first bent segment 12 and the second bent segment 22 can be substantially parallel or perpendicular to the width edges of the LED illuminant 300, which easily maintains consistency between products during flow line manufacturing. In addition, since the included angle between the first inclined segment 13 and the first bent segment 12 and the included angle between the second inclined segment 23 and the second bent segment 22 are both acute angles, the first base 11 may be disposed in the middle relative to the first bent segment 12 and the second base 21 may be disposed in the middle relative to the second bent segment 22, so that the first base 11 and the second base 21 may be disposed in the middle relative to the width edges of the LED illuminant 300, giving a better support to the LED illuminant 300. In addition, spacing S between the first base 11 and the second base 21 may be narrowed; when encapsulating the LED illuminant 300, the encapsulant flows along the first inclined segment 13 and the second inclined segment 23, then joining to flow toward the central area of the back side of the LED illuminant 300, which can not only control the encapsulant to travel a shorter distance along the first inclined segment 13 and the second inclined segment 23, but also facilitates the encapsulant to envelope the weld joints of the LED illuminant 300 with the first bent segment 12 and the second bent segment 22, whereby a better encapsulation effect is achieved.

Before placing the LED illuminant 300, the LED bead manufacturing procedure may further comprise the following step between S110 and S120 to ensure that the relative position between the first bent segment 12 and the second bent segment 22 satisfies the requirement of supporting the LED illuminant 300:

S111: adjusting spacing between the first bent segment 12 and the second bent segment 22 to satisfy a predetermined requirement.

This allows for the first pin 100 and the second pin 200 to better support and positionally retain the LED illuminant 300.

In an implementation, to reliably securely weld the LED illuminant 300, S120 may comprise the following steps:

S121: applying a solder to respective top surfaces of the first bent segment 12 and the second bent segment 22;

S122: disposing the LED illuminant 300 flatly on the first bent segment 12 and the second bent segment 22 from top to down;

S123: heating the solder applied on the first bent segment 12 and the second bent segment 22, cooling by air blowing so as to securely weld the LED illuminant 300.

A liquid solder may be applied, which is attached to the first bent segment 12 and the second bent segment 22 due to tension; after the LED illuminant 300 is placed, the LED illuminant 300 is attached by tension, which may enhance the effect of pre-locating the LED illuminant 300 on the mounting platform. The solder on the first bent segment 12 and the second bent segment 22 may be heated by hot-air blowing in a contactless manner, so that the position of the LED illuminant 300 relative to the first bent segment 12 and the second bent segment 22 is retained during the welding process, which also facilitates enhancing long-term reliability of the welded LED illuminant 300.

In addition, the LED bead encapsulating procedure comprises:

S200. inserting a qualified LED bead into the glass shade 500, ensuring that rear ends of the first pin 100 and the second pin 200 project out of the glass shade 500;

S210: hot melting a rear end of the glass shade 500 so that the rear end of the glass shade 500 is integrally secured to the first pin 100 and the second pin 200, whereby the rear end of the glass shade 500 is sealed;

S220: hot melting a portion of the glass shade 500 between the LED bead and a front end surface of the glass shade 500, and then drawing the front end of the glass shade 500 in a direction away from the rear end so that the hot-melted portion of the glass shade 500 is elongated to form a stretched segment, a bleed hole being retained in the stretched segment;

S230: extracting air in the glass shade 500 from the front end of the glass shade 500 via the bleed hole, hot melting the stretched segment to seal the bleed hole, and breaking off the stretched segment to thereby form the LED light bulb.

The manufacturing process described supra may be manually performed in a conventional manner, which, however, is inefficient with the product quality uncontrollable; therefore, the manufacturing process can be carried out by automatic machinery.

In addition to the specific implementations described supra, the disclosure further has other implementations; those skilled in the art may make various changes and modifications according to the disclosure, and all of such changes and modifications fall within the scope defined in the appended claims without departing from the spirits of the disclosure.

I claim:

1. A LED light bulb, comprising:

a glass shade and a LED bead, the LED bead being encapsulated in the glass shade, the LED bead comprising a first pin, a second pin, a LED illuminant, and a package body, the first pin and the second pin projecting out from a base of the glass shade, wherein a first bent segment is formed at a top end of the first pin, and a second bent segment is formed at a top end of the second pin, the first pin forms a structure comprising a first base and a first inclined segment and the second pin forms a structure comprising a second base and a second inclined segment, the first inclined segment being connected between the first base and the first bent segment, the second inclined segment being connected between the second base and the second bent segment, an included angle between the first inclined segment and the first bent segment and an included angle between the second inclined segment and the second bent segment being both acute angles, the first bent segment and the second bent segment being bent in opposite directions perpendicular to a plane defined by the first base and the second base, the first bent segment and the second bent segment being substantially disposed on a first plane to form a mounting platform, the first plane being substantially perpendicular to an axial direction of the glass shade, the first bent segment and the second bent segment are spaced apart on the first plane, and projections of the first and second bent segments overlap in a direction perpendicular to a length direction of the first bent segment;

the LED illuminant is disposed flatly on the first bent segment and the second bent segment from top to down, the LED illuminant is secured on the mounting platform, wherein the LED illuminant includes an LED chip being disposed on a front side of a substrate, a positive weld joint surface and a negative weld joint surface being provided on a back side of the substrate that faces the first plane and on which the positive weld joint surface and the negative weld joint surface are formed for connection to the first bent segment and the second bent segment, the positive weld joint surface and the negative weld joint surface being spaced apart by an insulative gap, the first bent segment being welded to the positive weld joint surface and the second bent segment being welded to the negative weld joint surface, such that the LED illuminant is supported by the first bent segment and the second bent segment at overlapping projections of the first bent egment and the second bent segment; and the package body encapsulates the LED illuminant and respective weld joints between the LED illuminant and the first bent segment and between the LED illuminant and the second bent segment.

2. The LED light bulb according to claim 1, wherein the LED light bulb adopts a white light source, the LED illuminant adopts a LED which emits white light, the package body adopts a transparent, colorless encapsulant, and the glass shade adopts colorless glass.

3. The LED light bulb according to claim 1, wherein the LED light bulb adopts a colored light source, the LED illuminant adopts a LED which emits colored light, the package body adopts a transparent, colorless encapsulant, and the glass shade adopts colorless glass;

or, the LED light bulb adopts a colored light source, the LED illuminant adopts a LED which emits white light, the package body adopts a transparent, colored encapsulant, and the glass shade adopts colorless glass;

or, the LED light bulb adopts a colored light source, the LED illuminant adopts a LED which emits white light, the package body adopts a transparent, colorless encapsulant, and the glass shade adopts colored glass.

4. A LED bulb manufacturing process, applied to manufacture the LED light bulb according to claim 1, comprising a step of forming the LED bead that is encapsulated by the glass shade, wherein the step of forming the LED bead that is encapsulated by the glass shade comprises:

S100: forming the first pin and the second pin with a metallic filament of a predetermined length;

S110: forming the first bent segment by bending the top end of the first pin and forming the second bent segment by bending the top end of the second pin, the first bent segment and the second bent segment being bent in the opposite directions to thereby form the mounting platform;

S120: forming a wick structure by securely welding the LED illuminant placed on the mounting platform, wherein the S120 comprises:

S121: applying a solder on respective top surfaces of the first bent segment and the second bent segment;

S122: disposing the LED illuminant flatly on the first bent segment and the second bent segment from top to down; and

S123: heating the solder on the first bent segment and the second bent segment and cooling by air blowing to connect to the positive weld joint surface and the negative wel di: surface;

S130: flipping the wick structure upside-down so that the LED illuminant faces downward, impregnating the LED illuminant in an encapsulant so that the encapsulant envelops the LED illuminant as well as respective weld joints between the LED illuminant and the first bent segment and between the LED illuminant and the second bent segment;

S140: forming the LED bead by curing the encapsulant to form the package body; and

S150: inspecting the LED bead by turning it on, wherein if the LED bead lights up, it is determined to be a qualified product.

5. The LED bulb manufacturing process according to claim 4, wherein the S110 further comprises: scraping off dirt from respective top surfaces of the first bent segment and the second bent segment while forming the first bent segment and the second bent segment by bending.

6. The LED bulb manufacturing process according to claim 4, wherein the step of forming the LED bead that is encapsulated by the glass shade further comprises between S100 and S110:

S101: transporting the first pin and the second pin engaged by a gripper to an inspection workstation where whether the first pin and the second pin are present on the gripper is inspected; continuing manufacturing in the case of presence, while suspending manufacturing in a case of absence.

7. The LED bulb manufacturing process according to claim 4, wherein the step of forming the LED bead that is encapsulated by the glass shade further comprises after S101:

S102: flattening top ends of the first pin and the second pin to increase respective contact areas between the first bent segment and the LED illuminant and between the second bent segment and the LED illuminant.

8. The LED bulb manufacturing process according to claim 4, wherein the S110 further comprises: when forming the first bent segment and the second bent segment by bending, performing shaping treatment to the first pin and the second pin so that the first pin forms a structure comprising a first base and a first inclined segment and the second pin forms a structure comprising a second base and a second inclined segment, the first inclined segment being connected between the first base and the first bent segment, the second inclined segment being connected between the second base and the second bent segment, an inclined angle between the first inclined segment and the first bent segment being an acute angle, an inclined angle between the second inclined segment and the second bent segment being an acute angle, the first bent segment and the second bent segment being bent in the opposite directions perpendicular to a plane defined by the first base and the second base.

9. The LED bulb manufacturing process according to claim 4, wherein the step of forming the LED bead that is encapsulated by the glass shade further comprises between S110 and S120:

S111: adjusting spacing between the first bent segment and the second bent segment to satisfy a predetermined requirement.

* * * * *